(12) United States Patent
Baumgartner

(10) Patent No.: US 6,998,850 B2
(45) Date of Patent: Feb. 14, 2006

(54) SYSTEMS AND METHODS FOR MEASURING PICOAMPERE CURRENT LEVELS

(75) Inventor: Richard A. Baumgartner, Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 81 days.

(21) Appl. No.: 10/683,194

(22) Filed: Oct. 10, 2003

(65) Prior Publication Data
US 2005/0077906 A1    Apr. 14, 2005

(51) Int. Cl.
G01R 31/08    (2006.01)
G01R 22/00    (2006.01)
G01R 19/00    (2006.01)

(52) U.S. Cl. .............. 324/522; 324/76.17; 702/64
(58) Field of Classification Search ............... 324/522, 324/512, 500, 658, 158.1, 348, 410, 548, 324/713, 684, 686; 73/54.25, 54.31; 702/64, 702/65, FOR. 106; 338/2; 323/277, 282, 323/316, 351; 327/52, 344
See application file for complete search history.

(56) References Cited

U.S. PATENT DOCUMENTS

| | | | | |
|---|---|---|---|---|
| 4,315,210 A | * | 2/1982 | Michel et al. ............. 324/612 |
| 4,631,410 A | * | 12/1986 | Nickles .................. 250/363.01 |
| 4,739,252 A | * | 4/1988 | Malaviya et al. ........... 324/115 |
| 4,794,333 A | * | 12/1988 | Milkovic .................... 324/142 |
| 4,963,747 A | * | 10/1990 | Thacker ...................... 250/388 |
| 5,612,698 A | * | 3/1997 | Reay .......................... 341/167 |
| 5,694,063 A | * | 12/1997 | Burlison et al. .............. 327/50 |
| 6,160,388 A | * | 12/2000 | Skelton et al. .............. 323/282 |
| 6,380,790 B1 | | 4/2002 | Denison |
| RE37,708 E | * | 5/2002 | Danstrom .................... 323/284 |
| 6,699,697 B1 | * | 3/2004 | Klemic et al. ........... 435/173.4 |
| 6,870,375 B1 | * | 3/2005 | Sarma et al. ................ 324/658 |
| 6,897,665 B1 | * | 5/2005 | Hung ......................... 324/751 |

* cited by examiner

Primary Examiner—Diane I. Lee
Assistant Examiner—Hoai-An D. Nguyen

(57) ABSTRACT

In one embodiment, a circuit measures picoampere current levels. The circuit comprises: an operational-amplifier that has differential inputs and differential outputs; a switching structure that switchably couples an input line to one of the differential inputs in response signals from a timing circuit; a first integrating capacitor coupled to one of the differential inputs and to one of the differential outputs; a second integrating capacitor coupled to the other of the differential inputs; and a charge injection compensation structure that selectively injects charge into the input line and removes charge from the input line in response to signals from the timing circuit.

17 Claims, 2 Drawing Sheets

SYSTEMS AND METHODS FOR MEASURING PICOAMPERE CURRENT LEVELS

TECHNICAL FIELD

Representative embodiments are directed to a capacitive feedback integrator that includes charge injection compensation functionality that is suitable for measuring picoampere current levels.

BACKGROUND OF THE INVENTION

A common method of converting a small current signal into output voltage signal utilizes an operational amplifier (op-amp) and a resistive feedback element to convert from input current to output voltage. An implementation of this method is described in chapter four, pages 175–261, of The Art of Electronics 2nd edition, Horowitz, P. and Hill, W., Cambridge University Press (1989). Resistive feedback op-amp circuits suffer from a basic limitation. Specifically, the measurement of picoampere current levels with high bandwidth is limited by the noise of the preamplifier system converting the small input current into a larger signal for subsequent signal processing. In applications using resistive feedback, the limiting noise is the thermal noise associated with the feedback resistor.

It may be possible to attempt to lower the feedback resistor value to reduce the resistor noise contribution and increase the bandwidth of the output. The noise of the feedback resistor scales with the square root of the resistor size. The transresistance scales with the resistor size. Accordingly, the transresistance through the preamplifier circuitry may not be sufficiently large to dominate the noise of the subsequent signal processing stages.

U.S. Pat. No. 6,380,790, which is incorporated herein by reference, discloses a circuit suitable for measuring small current levels that utilizes an integrator topology instead of an op-amp with a feedback resistor. The '790 patent utilizes capacitive feedback and, hence, requires periodic resets if the input current has a net direct current (DC) component. The reset operations require the use of switches to discharge the integrating capacitors. The switching operations cause transient injection of current.

The dominant noise limitation for circuits implemented according to the '790 topology is:

$$I_{noise} = K * C_{in} * En_{op\_amp} * BW^{1.5}, \text{ where}$$

$I_{noise}$ is the effective input noise current for the preamplifier, $C_{in}$ is the input capacitance of the preamplifier and the transducer, $En_{op\_amp}$ is the thermal noise of the op-amp, BW is the desired signal bandwidth, and K is an appropriate proportionality constant.

Given the preceding noise limitation, known implementations of circuits according to the '790 topology may only measure picoampere current levels with a bandwidth on the order of 10 kHz. Specifically, the internal capacitance due to the switching elements and the general wiring capacitance prevents measurement of picoampere current levels having a bandwidth of 100 kHz or greater.

BRIEF SUMMARY OF THE INVENTION

Representative embodiments enable picoampere current levels to be measured with bandwidths equal to or greater than 100 kHz. Representative embodiments enable such current measurements to occur by implementing the preamplifier of the integrator topology in integrated circuit form. By utilizing an integrated circuit form, the internal capacitance achieves significant advantages relative to a preamplifier constructed from discrete components mounted on a circuit board. For example, the general node capacitance level of the integrated circuit version is appreciably smaller. The load capacitances that the op-amps drive are also smaller, since the dimensions of the devices and the interconnect of the integrated circuit are smaller than the component counterparts for a structure realized on a circuit board. Moreover, the presence of the op-amps and interconnect components on an integrated circuit eliminates the necessity for electrostatic discharge (ESD) protection devices associated with each component of the preamplifier circuitry. By eliminating the ESD protection devices, the node capacitances may be maintained at a suitably low level. Also, the reduction in extraneous wiring capacitance enables further reduction of the capacitance of the integrating capacitors.

It shall be appreciated that the reduction of capacitance of the integrating capacitors affects the errors caused by the injection of charge due to the resets of the integrator capacitors. Specifically, when the internal capacitance is reduced, a smaller amount of injected charge will cause a greater deviation between the input current and the measured current. Representative embodiments adapt to the increased sensitivity to charge injection utilizing a plural number of mechanisms. Specifically, representative embodiments provide charge injection compensation structure to phase reversal switches to address unbalanced impedances on the input side of the phase reversal switches. Secondly, representative embodiments utilize slightly different operating points for inputs to the integrator op-amp. By utilizing a variety of charge injection compensation mechanisms, representative embodiments reduce the net charge injection to sufficiently low levels to maintain the switching transients to prevent appreciable corruption of the current measurement.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which.

DETAILED DESCRIPTION OF THE INVENTION

Figure 1:
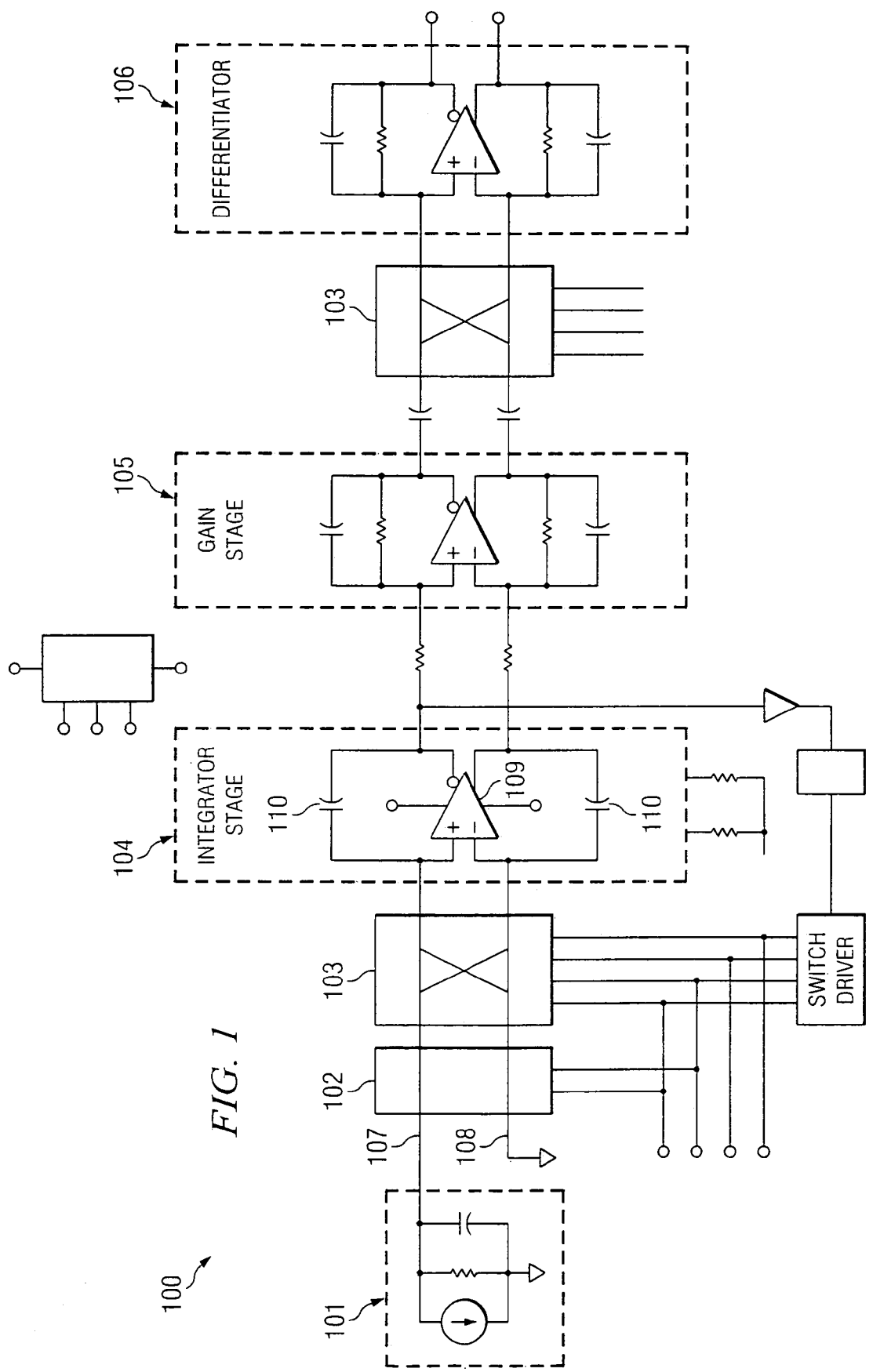
FIG. 1 depicts a circuit for measuring picoampere current levels that includes a capacitive feedback integrator with charge injection compensation functionality according to representative embodiments.

Referring now to the drawings, FIG. 1 depicts a schematic of picoammeter 100 according to representative embodiments. Picoammeter 100 may be advantageously implemented as an integrated circuit to reduce the internal capacitance and to increase the current measurement bandwidth to 100 kHz or greater as previously discussed.

Picoammeter 100 includes a plurality of stages. First stage model 101 represents a source of low level current to be measured by picoammeter 100. Picoammeter 100 includes integrator 104 with capacitive feedback elements 110. One of the capacitive feedback elements 110 couples the positive input of op-amp 109 to the negative output of op-amp 109. Likewise, the other one of capacitive feedback elements 110 couples the negative input of op-amp 109 to the positive output of op-amp 109. Capacitive feedback elements 110 may possess relatively low capacitance (e.g., 0.2 pF) to enable the bandwidth of integrator 104 to be increased.

Picoammeter 100 further includes switching structure 103 to switch the input current direction when the integrator level reaches a potential near one of the supply voltage values. The output of integrator 104 is amplified by gain stage 105 to effectively reduce the integration capacitor size without having to use an integration capacitor that is too small to be sufficiently repeatable from integrated circuit to integrated circuit. As shown in FIG. 1, the gain stage is followed by differentiator 106 to convert the integrator output signal from an integrated current versus time waveform to a current versus time waveform. Another switching structure 103 may be employed before differentiator 106 to cause the polarity of the output signal to remain constant through switching events.

In representative embodiments, the circuitry following integrator 104 (i.e., gain stage 105, differentiator 106, and the like) may be advantageously implemented to possess a bandwidth greater than that required to pass the bandwidth of the input current signal. By doing so, the duration of the transients generated by switching structure 103 will be relatively short. Specifically, the transients may last for approximately 1 μsec and the mitigation of the transients may be facilitated.

Also, the transresistance of integrator 104 through differentiator 106 is given by:

$(1/C_{int})*G*R_d*C_d$, where $C_{int}$ is the integrator capacitance size, G is the gain of gain stage 105, $R_d$ is the resistance of the feedback resistor, and $C_d$ is the input capacitor in differentiator 106.

Analog-to-digital (A/D) conversion may be performed on the output of gain stage 105 and differentiation may be performed by digital signal processing. Performing A/D conversion after gain stage 105 and before differentiation 106 involves a greater dynamic range for performing A/D conversion after differentiator 106. Digitizing the amplified output of integrator 104 is advantageous, because differentiation in the software domain reduces the degree to which the current measurement results will be affected by IC process variations. Also, software control of the differentiation process parameters provides the user greater flexibility to adjust the parameters to optimize the process.

A programmable gain amplifier (not shown) may follow differentiator 106. The programmatic gain amplifier may enable the current measurements to be made for a relatively wide range of current input levels. Also, an analog-to-digital (A/D) converter (not shown) may follow the programmable gain amplifier. The digital data from the A/D converter may be processed by a digital signal processor to generate a representation of the input current versus time.

Figure 2:
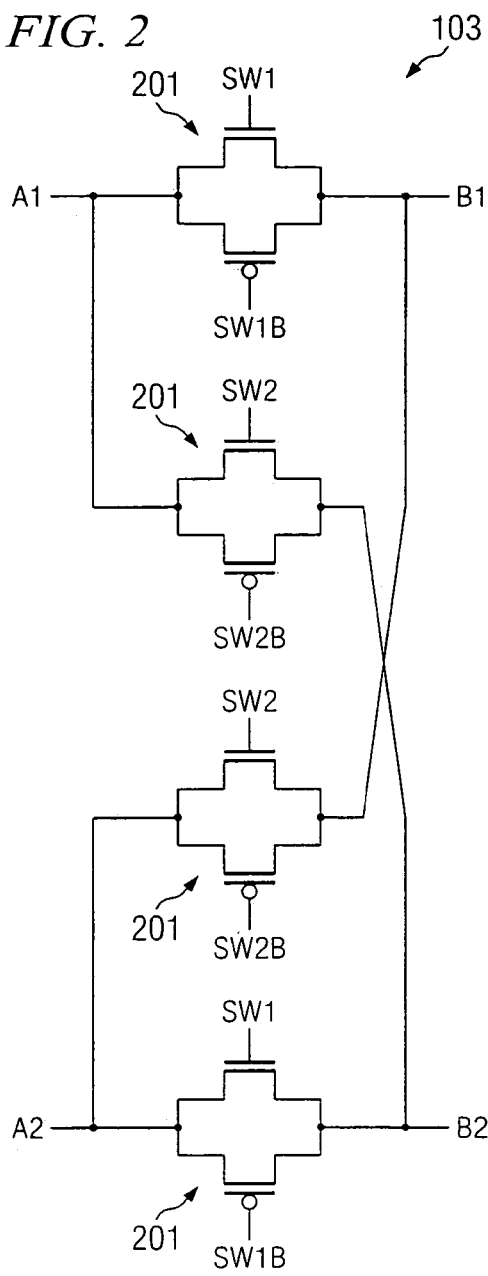
FIG. 2 depicts a switching structure for providing current reversal to a capacitive feedback integrator according to representative embodiments.

FIG. 2 depicts switching structure 103 in greater detail. Switching structure 103 utilizes a plurality of individual switches 201 to enable current to flow in opposite directions depending on the switching signals (SW1, SW1B, SW2, and SW2B) applied to the gates of switches 201. The capacitive balance of switching structure 103 is relatively good. Specifically, if nodes A1 and A2 are connected to circuit points having equal impedance levels and if nodes B1 and B2 are connected to circuit points having equal impedance levels, then the net amount of charge injected by a current reversal event will be relatively small.

However, as shown in FIG. 1, the integrator topology of picoammeter 100 does not exhibit the desired matched impedance levels. Specifically, the impedance level of node 107 (also denoted by INA) is different from the impedance level of node 108 (also denoted by INB). Node 107 is coupled to the high impedance input node associated with model 101 and node 108 is coupled to a bias level or analog ground. Accordingly, without respect to the operation of charge injection compensation structure 102, switching element 103 injects some amount of charge during current reversal events. Because the internal capacitance of picoammeter 100 is relatively small, this amount of injected charge would have a negative impact upon the accuracy of the current measurement.

Figure 3:
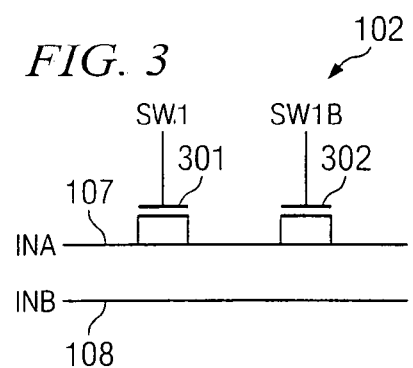
FIG. 3 depicts a plurality of charge injection devices according to representative embodiments.

Charge injection compensation structure 102 that compensates for the transients generated by current reversal events is shown in greater detail in FIG. 3. Charge injection compensation structure 102 couples the drain and source nodes of charge injection devices 301 and 302 to node 107. The charge injection device 302 is slightly wider (e.g., 0.05 μm) than charge injection device 301. The drive waveforms for charge injection devices 301 and 302 are also applied to switching elements 103 to cause the current reversal events thereby synchronizing charge injection compensation structure 102 to switching element 103. The drive waveforms (SW1 and SW1B) provided to charge injection devices 301 and 302 are the inverse of each other. Thus, one of charge injection devices 301 and 302 will inject charge into node 107 and the other will remove charge from node 107. The slight difference in the width between the gates of charge injection devices 301 and 302 enables a slight net amount of charge injection or removal to occur to compensate for the transients caused by a current reversal event.

Further charge injection compensation may occur by utilizing input offsets for operational amplifier 109 of integrator 104. The offset of operational amplifier 109 is typically adjustable due to the variation from chip to chip for the purpose of bringing the offset to zero according to known applications. In representative embodiments, a slight adjustment of the offset adjusting resistors of operational amplifier 109 from the input offset value of zero will reduce the transients at the switch points of switching structure 103 that are immediately before integrator 104. Specifically, if the drain-source voltage is increased there will be slightly less of a logic swing on the respective gate above the threshold where the capacitive coupling from the gate to the channel is the highest.

Figure 4:
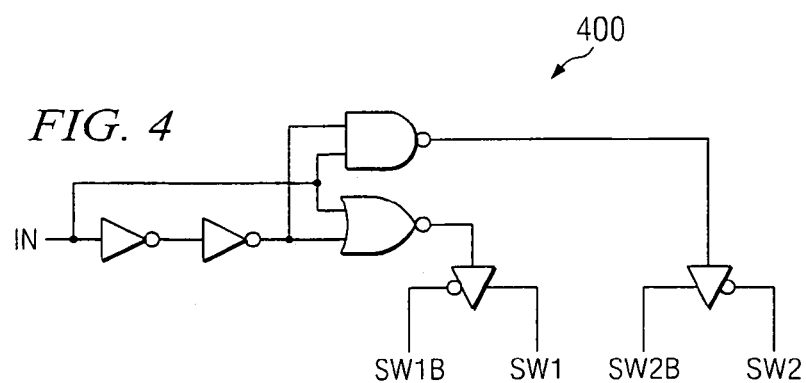
FIG. 4 depicts a timing generator for initiating current reversals according to representative embodiments.

Timing generator 400 is shown in FIG. 4 to provide the driving signals for switching elements 103 and charge injection compensation structure 102. Timing generator 400 drives the switches in a break before make sequence. The N device switches are driven by the SW1 or SW2 waveforms and the P device switches are driven by the SW1B or SW2B waveforms. As shown in FIG. 4, timing generator 400 may advantageously provide output waveforms with fast transitions and crossing voltages close to the mid voltage between zero and five volts. Based upon simulations, these characteristics are important to the performance of picoammeter 100.

Representative embodiments adapt op-amp 109 of integrator 104 to facilitate measurement of picoampere current levels. As previously noted, the reduction of the effective input noise current makes a low input capacitance desirable. However, there is a trade-off with the gain of the input stage. A large gain value improves the gain bandwidth of the op-amp and reduces the input voltage noise. A compromise for the design has an input capacitance value of 70 fF and a noise level of 5.5 nV/sqrt(Hz) for an input pair. The offset and the 1/f noise of op-amp 109 are also quite important. Op-amp 109 may utilize P devices for inputs, because P devices have a lower 1/f noise coefficient for certain suitable IC processes. External adjustment ports may be provided to control the input offset of op-amp 109. Also, op-amp 109 may be advantageously implemented as a differential input and output unit. This is superior to the pair of op-amps disclosed in the '790 patent. Specifically, a differential op-amp exhibits better matching that can be achieved using a pair of op-amps.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit for measuring picoampere current levels, comprising:
   an operational-amplifier that has differential inputs and differential outputs;
   a switching structure that switchably couples an input line to one of said differential inputs in response to signals from a timing circuit;
   a first integrating capacitor coupled to one of said differential inputs and to one of said differential outputs;
   a second integrating capacitor coupled to the other of said differential inputs and to the other of said differential outputs;
   a charge injection compensation structure that alternately injects charge into said input line and removes charge from said input line in response to signals from said timing circuit;
   wherein said charge injection compensation structure comprises:
      a first charge injection device that has a first width; and
      a second charge injection device that has a second width that is different than said first width, wherein said second charge injection device is driven by a waveform from said timing circuit that is an inverse of a waveform that drives said first charge injection device.

2. The circuit of claim 1 wherein said operational-amplifier, said switching structure, said first and second integrating capacitors, and said charge injection compensation structure are integrated on a single integrated circuit.

3. The circuit of claim 1 wherein said switching structure switchably couples an analog ground to the other of said differential inputs of said operational-amplifier in response to a timing circuit.

4. The circuit of claim 1 wherein said switching structure switchably couples a bias level to the other of said differential inputs of said operational-amplifier in response to a timing circuit.

5. The circuit of claim 1 wherein said operational-amplifier has an adjustable direct-current (DC) offset for said differential inputs, wherein said DC offset is a non-zero offset adjusted to minimize charge injection caused by switching of said switching structure.

6. The circuit of claim 1 further comprising:
   a gain stage that is operable to amplify said differential outputs of said operational-amplifier.

7. The circuit of claim 1 further comprising:
   a differentiator for differentiating said differential outputs of said operational-amplifier.

8. A method for integrating a signal to facilitate measurement of picoampere current levels, comprising:
   receiving said signal on an input line;
   switchably providing said signal to differential inputs of an operational-amplifier in response to a timing circuit;
   integrating said signal utilizing a first integrating capacitor coupled to a first input of said differential inputs and to a first output of differential outputs of said operational-amplifier and a second integrating capacitor coupled to a second input of said differential inputs and a second output of said differential outputs;
   alternately injecting charge into and removing charge from said input line in response to said timing circuit;
   wherein said alternately injecting and removing charge includes:
      driving a first charge injection device that has a first width according to a first waveform; and
      driving a second charge injection device that has a second width that is different than said first width, wherein said second charge injection device is driven by a second waveform that is an inverse of said first waveform.

9. The method of claim 8 further comprising:
differentiating said differential outputs of said operational-amplifier.

10. The method of claim 8 wherein said receiving, switchably providing, integrating, and said selectively injecting and removing charge are performed on a single integrated circuit.

11. The method of claim 8 further comprising:
switchably providing an analog ground to an input of said different inputs opposite to said input that receives said signal in response to a timing circuit.

12. The method of claim 8 further comprising:
switchably providing a bias level to an input of said different inputs opposite to said input that receives said signal in response to a timing circuit.

13. The method of claim 8 wherein said operational-amplifier has an adjustable direct-current (DC) offset for said differential inputs, wherein said DC offset is a non-zero offset adjusted to minimize charge injection caused by switching of said switching structure.

14. The method of claim 8 further comprising:
amplifying said differential outputs of said operational-amplifier.

15. A circuit for measuring picoampere current levels, comprising:
operational-amplifier means for amplifying differential inputs;
switching means for switchably coupling an input line to one of said differential inputs in response to signals from a timing circuit;
first capacitor means, for integrating a signal from said input line, coupled to one of said differential inputs and to one of differential outputs of said operational-amplifier means;
second capacitor means, for integrating said signal from said input line, coupled to the other of said differential inputs and to the other of differential outputs of said operational-amplifier means;
charge injection compensation means for alternately injecting charge into said input line and removing charge from said input line in response to signals from said timing circuit;
wherein said charge injection compensation means comprises:
a first charge injection means having a first width; and
a second charge injection means having a second width that is different than said first width, wherein said second charge injection means is driven by a waveform from said timing circuit that is an inverse of a waveform that drives said first charge injection means.

16. The circuit of claim 15 further comprising:
gain stage means for amplifying said differential outputs of said operational-amplifier.

17. The circuit of claim 15 wherein said operational-amplifier means, said switching means, said first and second capacitor means, and said charge injection compensation means are integrated on a single integrated circuit.

* * * * *